(12) United States Patent  (10) Patent No.: US 7,638,880 B2
Shen et al.  (45) Date of Patent: Dec. 29, 2009

(54) CHIP PACKAGE

(75) Inventors: Geng-Shin Shen, Tainan County (TW); David Wei Wang, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 12/198,536

(22) Filed: Aug. 26, 2008

(65) Prior Publication Data

US 2008/0308916 A1  Dec. 18, 2008

Related U.S. Application Data

(63) Continuation-in-part of application No. 11/481,719, filed on Jul. 5, 2006, now abandoned.

(30) Foreign Application Priority Data

Mar. 17, 2006 (TW) .............................. 95109125 A

(51) Int. Cl.
 *H01L 23/12* (2006.01)
(52) U.S. Cl. .................. 257/777; 257/673; 257/780; 257/781; 257/782; 257/783; 257/787; 257/E23.018; 257/E23.033; 257/E23.039; 257/E23.127; 257/E21.511
(58) Field of Classification Search ................ 257/777
See application file for complete search history.

(56) References Cited

U.S. PATENT DOCUMENTS

| 6,057,598 | A | 5/2000 | Payne et al. |
| 6,380,615 | B1 | 4/2002 | Park et al. ............ 257/686 |
| 6,388,313 | B1 | 5/2002 | Lee et al. |
| 6,472,736 | B1 | 10/2002 | Yeh et al. |
| 6,555,917 | B1 | 4/2003 | Heo |
| 6,657,290 | B2 | 12/2003 | Fukui et al. |

(Continued)

FOREIGN PATENT DOCUMENTS

CN    1577779 A    2/2005

OTHER PUBLICATIONS

U.S. Office Action Summary of U.S. Appl. No. 12/198,517, dated May 13, 2009.

(Continued)

*Primary Examiner*—Jasmine J Clark
(74) *Attorney, Agent, or Firm*—J.C. Patents

(57) ABSTRACT

A chip package including a carrier having an opening, a first chip, bumps, a second chip, bonding wires, a first adhesive layer and a molding compound is provided. The first chip and the second chip are disposed at two opposite side of the carrier. The bumps are disposed between the carrier and a first active surface of the first chip to electrically connect with the first chip and the carrier. The bonding wires pass through the opening of the carrier and are electrically connected with the carrier and the second chip. The first adhesive layer adhered between the first active surface of the first chip and the carrier includes a first B-staged adhesive layer adhered on the first active surface of the first chip and a second B-staged adhesive layer adhered between the first B-staged adhesive layer and the carrier.

17 Claims, 4 Drawing Sheets

U.S. PATENT DOCUMENTS

| | | |
|---|---|---|
| 6,703,075 B1 | 3/2004 | Lin et al. |
| 6,943,061 B1 | 9/2005 | Sirinorakul et al. |
| 7,413,927 B1 * | 8/2008 | Patwardhan et al. ........ 438/108 |
| 2002/0005577 A1 | 1/2002 | Shimoda |
| 2002/0089050 A1 | 7/2002 | Michii et al. |
| 2002/0180025 A1 | 12/2002 | Miyata et al. |
| 2003/0006496 A1 * | 1/2003 | Vaiyapuri ................... 257/686 |

OTHER PUBLICATIONS

U.S. Office Action Summary of U.S. Appl. No. 12/244,553, dated May 13, 2009.

Chinese First Examination Report of China Application No. 2008101755291, dated on Aug. 29, 2009.

* cited by examiner

CHIP PACKAGE

CROSS-REFERENCE TO RELATED APPLICATION

This application is a continuation in part (CIP) application of application Ser. No. 11/481,719, filed on Jul. 5, 2006, which claims the priority benefit of Taiwan application serial No. 95109125, filed on Mar. 17, 2006. All disclosure of the cross-references is incorporated herein by reference.

BACKGROUND OF THE INVENTION

1. Field of the Invention

The present invention generally relates to a chip package. More particularly, the present invention relates to a chip package with enhanced reliability and reduced production cost.

2. Description of Related Art

In recent years, chip package having a plurality of stacked chips is gradually developed. In most chip packages, the chips are stacked over and electrically connected to a carrier (e.g. a printed circuit board or a lead-frame) through bonding wires or bumps, such as gold bumps, copper bumps, polymer bump, or solder bumps. Generally, each of the chips stacked over the carrier is adhered with the other chips or the carrier by an adhesive (e.g. tapes or adhesion glue). Specifically, the tape with proper size and stickiness is attached on the chips or on the carrier when the tapes are used in the die-bonding process or chip-stacking process; and the adhesion glue is dispensed on the chips or on the carrier and is then cured when the adhesion glue is used in the die-bonding process or chip-stacking process. Since the tape must be cut into proper size in advance when using for performing the die-bonding process or chip-stacking process, the use of the tape is unfavorable to mass production. Additionally, the reliability of the chip package is affected because the thickness of the adhesion glue is difficult to control. Therefore, a solution is required to enhance the reliability and reduce the production cost of chip packages.

SUMMARY OF THE INVENTION

The present invention is to provide a chip package having enhanced reliability and reduced production cost.

A chip package including a carrier having an opening, a first chip, a plurality of bumps, a second chip, a plurality of bonding wires, a first adhesive layer and a molding compound is provided. The first chip has a first active surface and a first rear surface opposite to the first active surface. The first chip and the second chip are disposed at two opposite side of the carrier. The bumps are disposed between the carrier and a first active surface of the first chip, and the first chip is electrically connected with the carrier and through the bumps. The bonding wires electrically connected with the carrier and the second chip, wherein each of the bonding wires passes through the opening of the carrier. The first adhesive layer adhered between the first active surface of the first chip and the carrier includes a first B-staged adhesive layer adhered on the first active surface of the first chip and a second B-staged adhesive layer adhered between the first B-staged adhesive layer and the carrier. The molding compound is disposed on the carrier to cover the first chip, the second chip, the bumps, the first adhesive layer and the bonding wires.

According to an embodiment of the present invention, the carrier may be a circuit board. For example, the opening of the circuit board is a though hole or a notch.

According to an embodiment of the present invention, the carrier may be a leadframe.

According to an embodiment of the present invention, the first chip has a plurality of first bonding pads electrically connected with the bumps.

According to an embodiment of the present invention, the second chip has a plurality of second bonding pads electrically connected with the bonding wires.

According to an embodiment of the present invention, the second bonding pads are exposed by the opening of the carrier.

According to an embodiment of the present invention, the bonding wires include gold wires.

According to an embodiment of the present invention, the second chip has a second rear surface and a second active surface opposite to the second rear surface, the second active surface of the second chip is adhered with the carrier.

According to an embodiment of the present invention, the chip package further includes a second adhesive layer adhered between the second active surface of the second chip and the carrier. For example, the second adhesive layer includes a third B-staged adhesive layer adhered on the first active surface of the first chip and a fourth B-staged adhesive layer adhered between the third B-staged adhesive layer and the circuit substrate.

According to an embodiment of the present invention, a glass transition temperature of the third B-staged adhesive layer is substantially the same with or different from a glass transition temperature of the fourth B-staged adhesive layer.

According to an embodiment of the present invention, a glass transition temperature of the first B-staged adhesive layer is substantially the same with or different from a glass transition temperature of the second B-staged adhesive layer.

According to an embodiment of the present invention, the first B-staged adhesive layer covers the first active surface of the first chip except for an area occupied by the bumps, and the second B-staged adhesive layer disposed on a portion area of the first B-staged adhesive layer to encapsulate a top portion of each bonding wire. For example, the second B-staged adhesive layer is disposed on a portion area of the first B-staged adhesive layer without encapsulating the bumps.

According to an embodiment of the present invention, the first B-staged adhesive layer includes a plurality of first B-staged adhesive posts, the second B-staged adhesive layer includes a plurality of second B-staged adhesive posts disposed on the first B-staged adhesive posts, and the first B-staged adhesive posts and the second B-staged adhesive posts encapsulate the bumps.

According to an embodiment of the present invention, the first B-staged adhesive layer covers the first active surface of the first chip except for an area occupied by the bumps, the second B-staged adhesive layer includes a plurality of second B-staged adhesive posts disposed on the first B-staged adhesive layer, and the first B-staged adhesive layer and the second B-staged adhesive posts encapsulate the bumps.

Since the first adhesive layer utilized in the present invention includes a first B-staged adhesive layer and a second B-staged adhesive layer, the thickness of the first adhesive layer is easily controlled. Additionally, the first adhesive layer is favorable to mass production, since the first adhesive layer can be formed over the surface of a wafer.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

Figure 1:
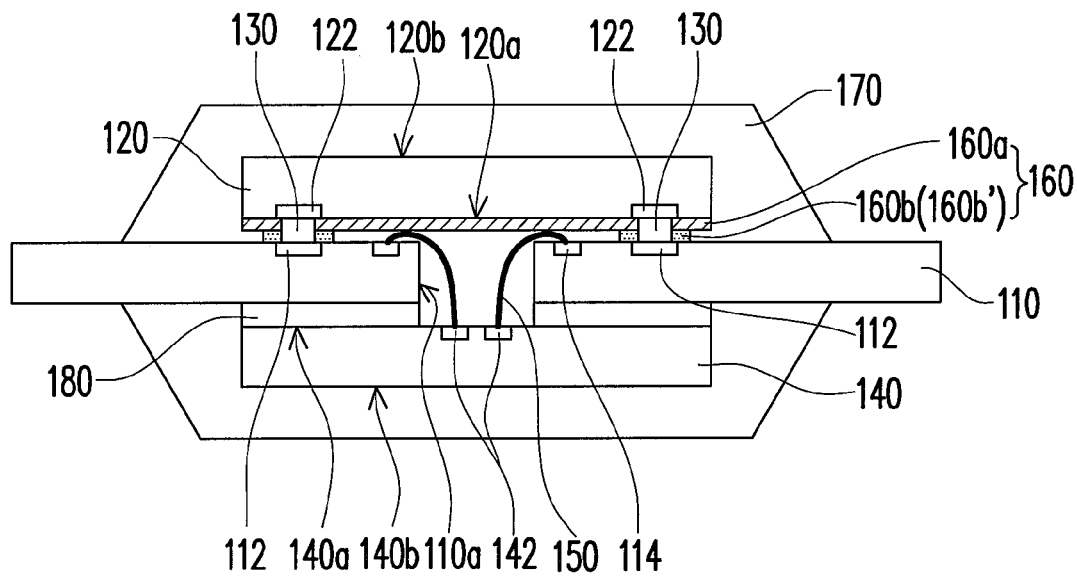
FIG. 1 is a schematic cross-sectional view showing a chip package according to the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic cross-sectional view showing a chip package according to the first embodiment of the present invention. Referring to FIG. 1, the chip package 100 of the present invention includes a carrier 110 having an opening 110a, a first chip 120, a plurality of bumps 130, a second chip 140, a plurality of bonding wires 150, a first adhesive layer 160 and a molding compound 170 is provided. The first chip 120 has a first active surface 120a and a first rear surface 120b opposite to the first active surface 120a. The first chip 120 and the second chip 140 are disposed on the carrier 110 and located at two opposite side of the carrier 110. The bumps 130 are disposed between the carrier 110 and a first active surface 120a of the first chip 120, and the first chip 120 is electrically connected with the carrier 110 and through the bumps 130. The bonding wires 150 electrically connected with the carrier 110 and the second chip 140, wherein each of the bonding wires 150 passes through the opening 110a of the carrier 110. The first adhesive layer 160 adhered between the first active surface 120a of the first chip 120 and the carrier 110 includes a first B-staged adhesive layer 160a adhered on the first active surface 120a of the first chip 120 and a second B-staged adhesive layer 160b adhered between the first B-staged adhesive layer 120a and the carrier 110. The molding compound 170 is disposed on the carrier 110 to cover the first chip 120, the second chip 140, the bumps 130, the first adhesive layer 160 and the bonding wires 150.

In the present embodiment, the carrier 110 may be a circuit board, such as FR-4 substrate, FR-5 substrate, BT substrate, or the like. In an alternative embodiment, the carrier 110 may be a leadframe.

Figure 7A:
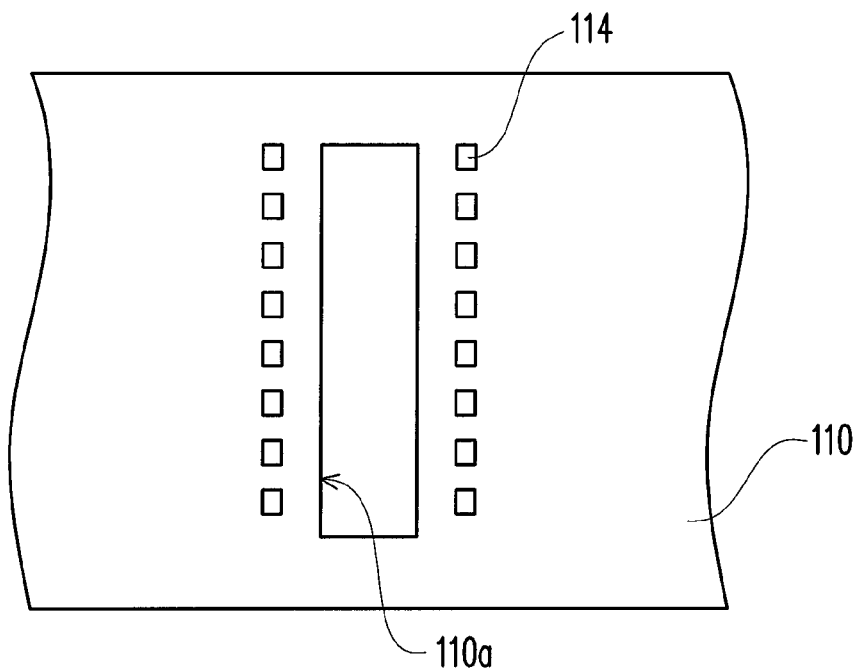
FIG. 7A and FIG. 7B are top views showing the circuit substrates according to the different embodiments of the present invention.
Figure 7B:
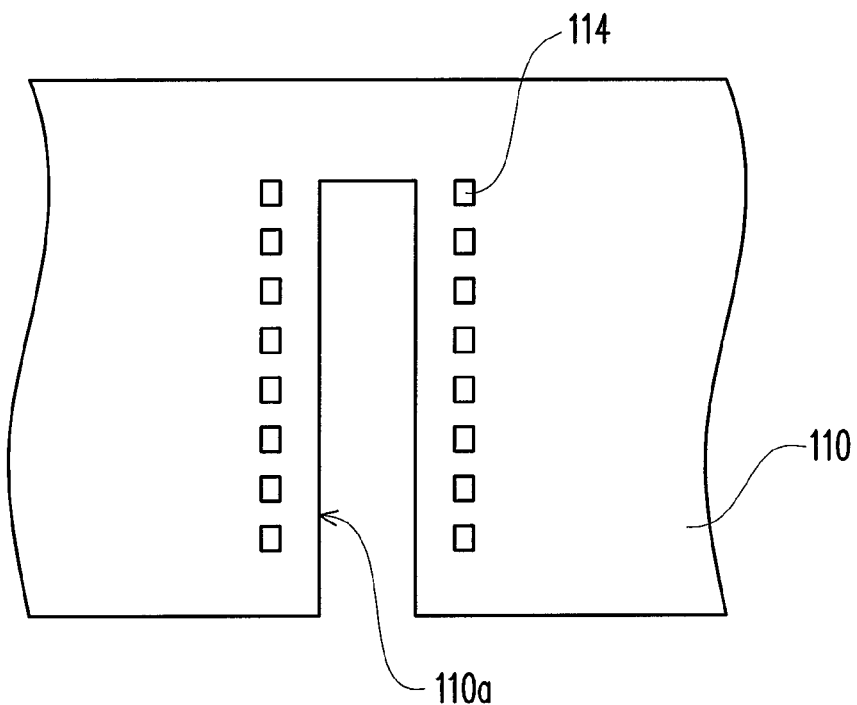

As shown in FIG. 1, the carrier 110 is a circuit board, for example, has a plurality of first connecting pads 112 disposed on a surface of the circuit board 110, while the first chip 120 has a plurality of first bonding pads 122. The first connecting pads 112 are electrically connected with the first bonding pads 122 of the first chip 120 through the bumps 130. Additionally, the circuit board 110 may further includes a plurality of second connecting pads 114, while the second chip 140 has a plurality of second bonding pads 142. The second connecting pads 114 are disposed around the opening 110a of the circuit board 110, and the second bonding pads 142 are exposed by the opening 110a of the circuit substrate 110. The second connecting pads 114 are electrically connected to the second bonding pads 142 through the bonding wires 150. In the present embodiment, the bonding wires 150 are gold wires formed by wire bonding process. It is noted that the opening 110a of the circuit substrate 110 may be a though hole (shown in FIG. 7A) or a notch (shown in FIG. 7B). However, the opening 110a of the circuit board 110 can be of any suitable shape.

In the present embodiment of the present invention, the first chip 120 and the second chip 140 are covered completely by the molding compound 170. In another embodiment, in order to enhance the heat dissipation performance, the first chip 120 and the second chip 140 may be partially encapsulated by the molding compound 170 (not shown). In other words, a portion of the surface of the first chip 120 and the second chip 140 can be exposed.

As shown in FIG. 1, the molding compound 170 fills into the opening 110a of the circuit board 110 and encapsulates the bonding wires 150 so as to prevent the bonding wires 150 from being damaged.

In the present embodiment, the first adhesive layer 160 is formed on the first active surface 120a of the first chip 120 in advance. Specifically, a wafer having a plurality of first chip 120 arranged in an array is first provided. Then, a first two-stage adhesive layer is formed over the first active surface 120a of the first chip 120 and is partially cured by heating or UV irradiation to form the first B-staged adhesive layer 160a. Afterward, a second two-stage adhesive layer is formed over the first B-staged adhesive layer 160a. Ultimately, the second two-stage adhesive layer is partially cured by heating or UV irradiation to form the second B-staged adhesive layer 160b. At this time, the first B-staged adhesive layer 160a and the second B-staged adhesive layer 160b are formed on the active surface of the wafer. When the wafer is cut, a plurality of first chip 120 having the first adhesive layer 160 on the first active surface 120a thereof is obtained. Therefore, the first adhesive layer 160 including the first B-staged adhesive layer 160a and the second B-staged adhesive layer 160b is favorable to mass production. Additionally, the first B-staged adhesive layer 160a and the second B-staged adhesive layer 160b may be formed by spin-coating, printing, or other suitable processes.

After the second B-staged adhesive layer 160b is partially cured, the first B-staged adhesive layer 160a is further cured and has greater mechanical strength to maintain the gap between the first chip 120 and the carrier 110. At this time, the first B-staged adhesive layer 160a may be partially cures or fully cured to provide sufficient support, and the second B-staged adhesive layer 160b may be soft and sticky. As shown in FIG. 1, the first B-staged adhesive layer 160a covers the first active surface 120a of the first chip 120 except for an area occupied by the bumps 130, and the second B-staged adhesive layer 160b includes a plurality of second B-staged adhesive posts 160b' disposed on the first B-staged adhesive layer 160a, and the first B-staged adhesive layer 160a and the second B-staged adhesive posts 160b' encapsulate the bumps 130.

In the present embodiment, the first B-staged adhesive layer 160a and the second B-staged adhesive layer 160b are fully cured after the first chip 120 being attached to the carrier 110 or being encapsulated by the molding compound 170. The first B-staged adhesive layer 160a and the second B-staged adhesive layer 160b can be obtained from 8008 or 8008HT of ABLESTIK, and the glass transition temperature of which is between about 80° C. and about 300° C. Additionally, the first B-staged adhesive layer 160a and the second B-staged adhesive layer 160b can also be obtained from 6200, 6201 or 6202C of ABLESTIK or obtained from SA-200-6, SA-200-10 provided by HITACHI Chemical CO., Ltd., and the glass transition temperature of which is between about −40° C. and about 150° C. The glass transition temperature of the first B-staged adhesive layer 160a is greater than, substantially the same with, or smaller than the glass transition temperature of the second B-staged adhesive layer 160b. Additionally, some conductive particles (e.g. silver particles, copper particles, gold particles) are doped in the first B-staged adhesive layer 160a and the second B-staged adhesive layer 160b, for example.

As shown in FIG. 1, the second chip 140 has a second rear surface 140b and a second active surface 140a opposite to the second rear surface 140b, the second active surface 140a of the second chip 140 is adhered with the carrier 110. Additionally, the chip package 100 may further includes a second adhesive layer 180 adhered between the second active surface 140a of the second chip 140 and the carrier 110. In other words, the second chip 140 is bonded onto the carrier 110 by the second adhesive layer 180.

Figure 2:
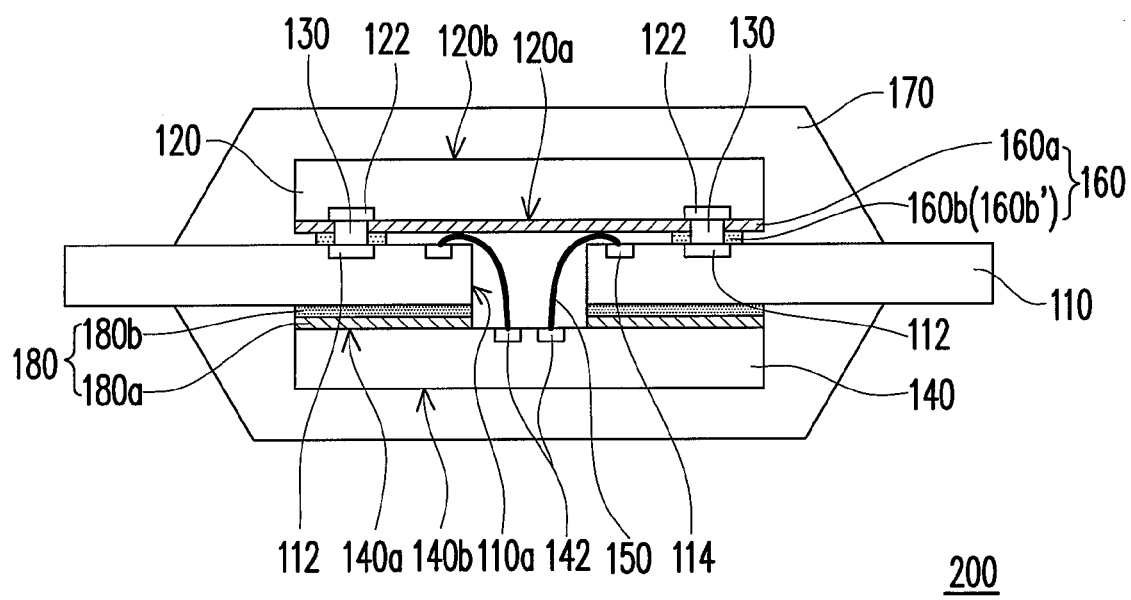
FIG. 2 is a schematic cross-sectional view showing a chip package according to the second embodiment of the present invention.

FIG. 2 is a schematic cross-sectional view showing a chip package according to the second embodiment of the present invention. Referring to FIG. 1 and FIG. 2, the chip package 200 of the present embodiment is similar with the chip package 100 shown in FIG. 1 except that the second adhesive layer 180 of the chip package 200 includes a third B-staged adhesive layer 180a adhered on the second active surface 140a of the second chip 140 and a fourth B-staged adhesive layer 180b adhered between the third B-staged adhesive layer 180a and the carrier 110. It is noted that the third B-staged adhesive layer 180a and the fourth B-staged adhesive layer 180b may be formed on the second active surface 140a of the second chip 140 or on the carrier 110 by spin-coating, printing, or other suitable processes.

In the present embodiment, the third B-staged adhesive layer 180a and the fourth B-staged adhesive layer 180b are fully cured after the second chip 140 being attached to the carrier 110 or being encapsulated by the molding compound 170. The third B-staged adhesive layer 180a and the fourth B-staged adhesive layer 180b can be obtained from 8008 or 8008HT of ABLESTIK, and the glass transition temperature of which is between about 80° C. and about 300° C. Additionally, the third B-staged adhesive layer 180a and the fourth B-staged adhesive layer 180b can also be obtained from 6200, 6201 or 6202C of ABLESTIK or obtained from SA-200-6, SA-200-10 provided by HITACHI Chemical CO., Ltd., and the glass transition temperature of which is between about −40° C. and about 150° C. The glass transition temperature of the third B-staged adhesive layer 180a is greater than, substantially the same with, or smaller than the glass transition temperature of the fourth B-staged adhesive layer 180b. Additionally, some conductive particles (e.g. silver particles, copper particles, gold particles) are doped in the third B-staged adhesive layer 180a and the fourth B-staged adhesive layer 180b, for example.

Figure 3:
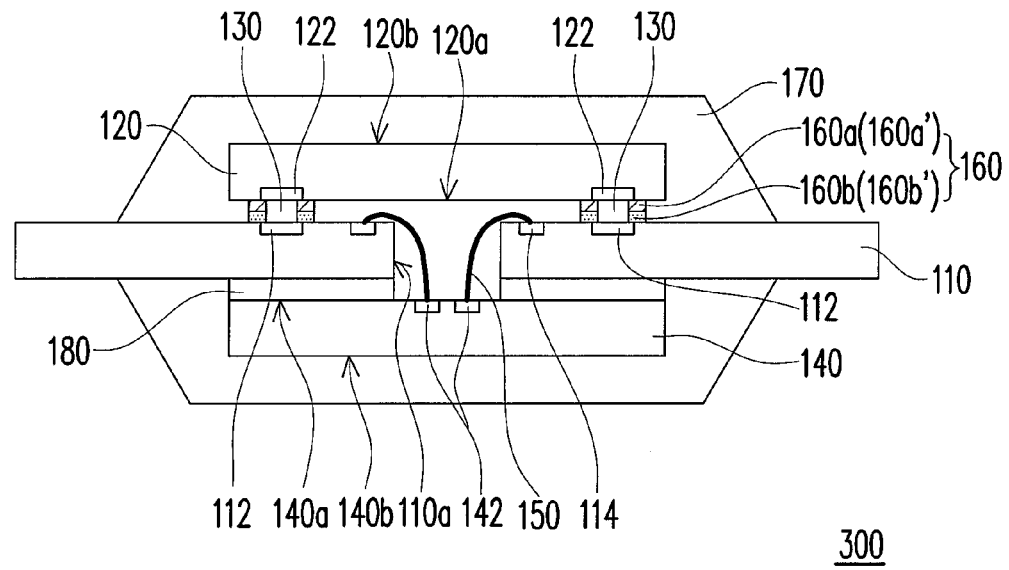
FIG. 3 is a schematic cross-sectional view showing a chip package according to the third embodiment of the present invention.

FIG. 3 is a schematic cross-sectional view showing a chip package according to the third embodiment of the present invention. Referring to FIG. 3, the chip package 300 of the present embodiment is similar with the chip package 100 shown in FIG. 1 except that the first B-staged adhesive layer 160a includes a plurality of first B-staged adhesive posts 160a', the second B-staged adhesive layer 160b includes a plurality of second B-staged adhesive posts 160b' disposed on the first B-staged adhesive posts 160a', and the first B-staged adhesive posts 160a' and the second B-staged adhesive posts 160b' encapsulate the bumps 130.

Figure 4:
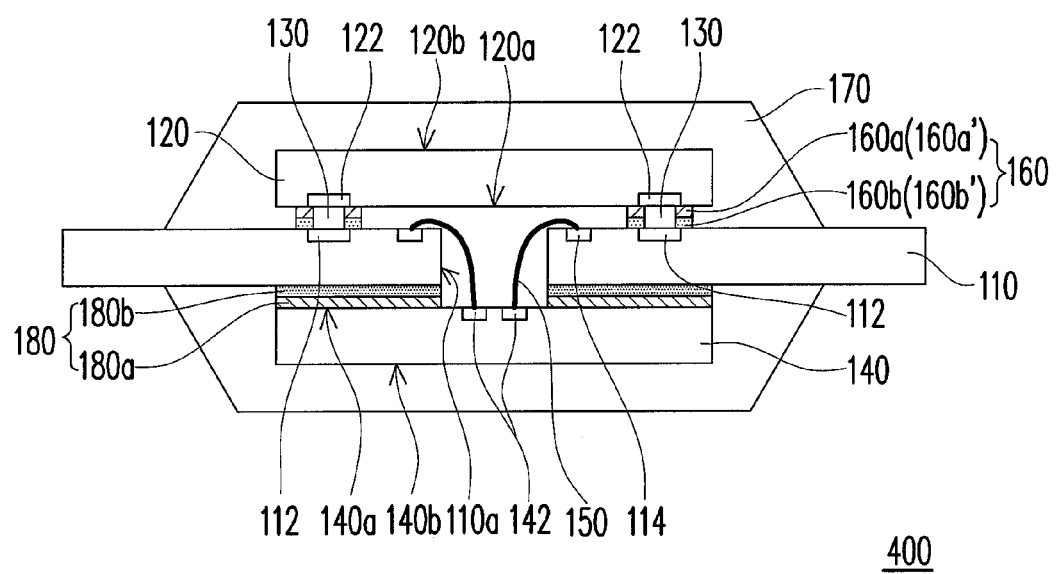
FIG. 4 is a schematic cross-sectional view showing a chip package according to the fourth embodiment of the present invention.

FIG. 4 is a schematic cross-sectional view showing a chip package according to the fourth embodiment of the present invention. Referring to FIG. 4, the chip package 400 of the present embodiment is similar with the chip package 300 shown in FIG. 3 except that the second adhesive layer 180 of the chip package 400 includes a third B-staged adhesive layer 180a adhered on the second active surface 140a of the second chip 140 and a fourth B-staged adhesive layer 180b adhered between the third B-staged adhesive layer 180a and the carrier 110.

Figure 5:
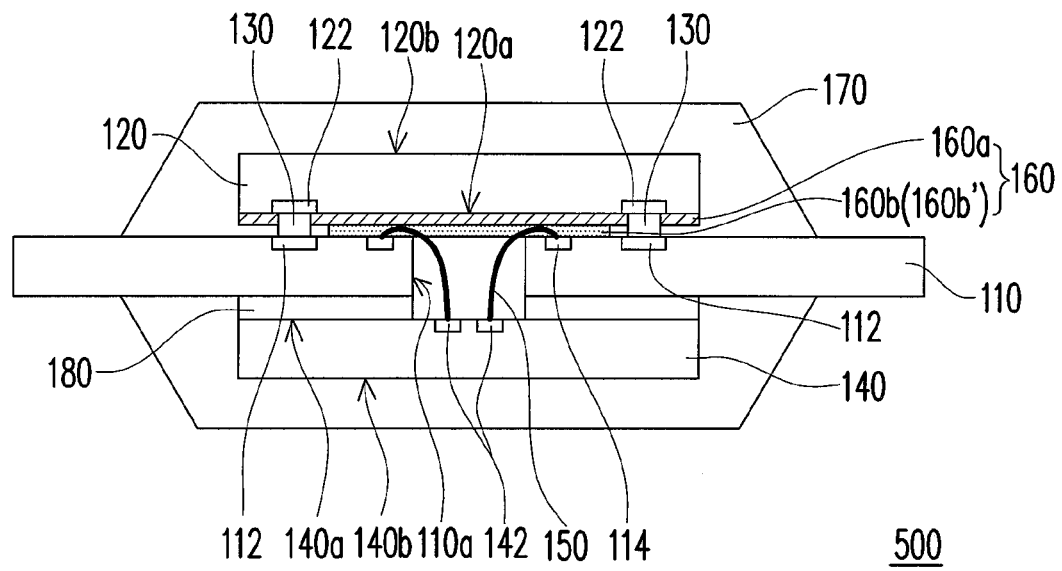
FIG. 5 is a schematic cross-sectional view showing a chip package according to the fifth embodiment of the present invention.

FIG. 5 is a schematic cross-sectional view showing a chip package according to the fifth embodiment of the present invention. Referring to FIG. 5, the chip package 500 of the present embodiment is similar with the chip package 100 shown in FIG. 1 except that the second B-staged adhesive layer 160b disposed on a portion area of the first B-staged adhesive layer 160a to encapsulate a top portion of each bonding wire 150. Specifically, the second B-staged adhesive layer 160b may be disposed on a portion area of the first B-staged adhesive layer 160a without encapsulating the bumps 130.

Figure 6:
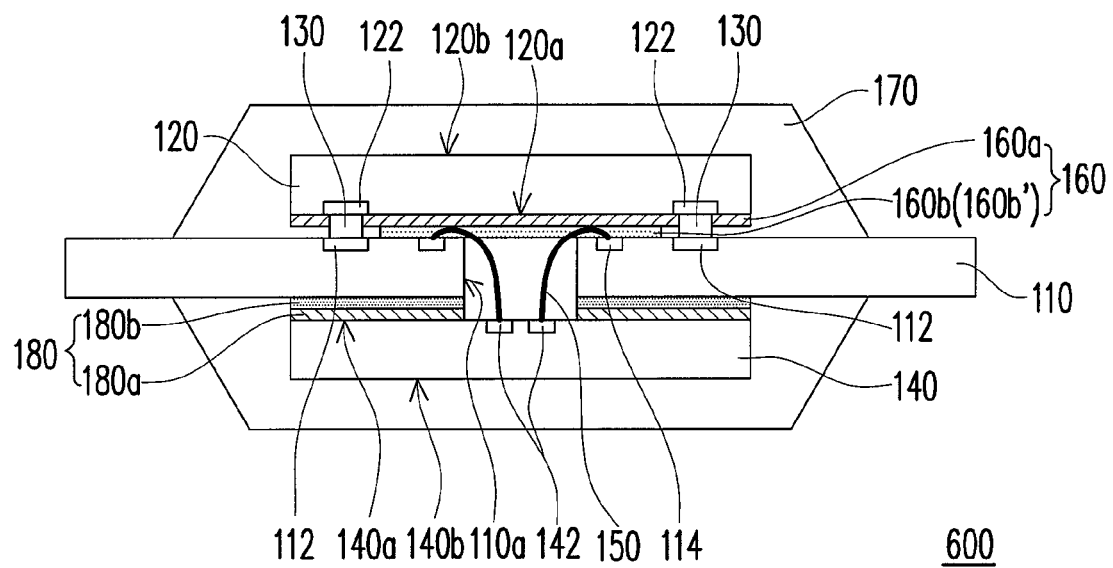
FIG. 6 is a schematic cross-sectional view showing a chip package according to the sixth embodiment of the present invention.

FIG. 6 is a schematic cross-sectional view showing a chip package according to the sixth embodiment of the present invention. Referring to FIG. 6, the chip package 600 of the present embodiment is similar with the chip package 500 shown in FIG. 5 except that the second adhesive layer 180 of the chip package 400 includes a third B-staged adhesive layer 180a adhered on the second active surface 140a of the second chip 140 and a fourth B-staged adhesive layer 180b adhered between the third B-staged adhesive layer 180a and the carrier 110.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A chip package, comprising:
a carrier having an opening;
a first chip disposed on the carrier, wherein the first chip has a first active surface and a first rear surface opposite to the first active surface;
a plurality of bumps disposed between the carrier and the first active surface of the first chip, wherein the first chip is electrically connected with the carrier and through the bumps;
a second chip disposed on the carrier, wherein the first chip and the second chip are located at two opposite side of the carrier;
a plurality of bonding wires electrically connected with the carrier and the second chip, wherein each of the bonding wires passes through the opening of the carrier; and
a first adhesive layer adhered between the first active surface of the first chip and the carrier, wherein the first adhesive layer comprises:
a first B-staged adhesive layer adhered on the first active surface of the first chip; and
a second B-staged adhesive layer adhered between the first B-staged adhesive layer and the carrier and a molding compound disposed on the carrier to cover the first chip, the second chip, the bumps, the first adhesive layer and the bonding wires;
a second adhesive layer adhered between the second active surface of the second chip and the carrier, wherein the second adhesive layer comprises:
a third B-staged adhesive layer adhered on the first active surface of the first chip; and
a fourth B-staged adhesive layer adhered between the third B-staged adhesive layer and the circuit substrate.

2. The chip package in accordance with claim 1, wherein the carrier comprises a circuit board.

3. The chip package in accordance with claim 2, wherein the opening is a through hole or a notch.

4. The chip package in accordance with claim 1, wherein the carrier comprises a leadframe.

5. The chip package in accordance with claim 1, wherein the first chip has a plurality of first bonding pads electrically connected with the bumps.

6. The chip package in accordance with claim 1, wherein the second chip has a plurality of second bonding pads electrically connected with the bonding wires.

7. The chip package in accordance with claim 6, wherein the second bonding pads are exposed by the opening of the carrier.

8. The chip package in accordance with claim 1, wherein the bonding wires comprise gold wires.

9. The chip package in accordance with claim 1, wherein the second chip has a second rear surface and a second active surface opposite to the second rear surface, the second active surface of the second chip is adhered with the carrier.

10. The chip package according to claim 1, wherein a glass transition temperature of the third B-staged adhesive layer is substantially the same with a glass transition temperature of the fourth B-staged adhesive layer.

11. The chip package according to claim 1, wherein a glass transition temperature of the third B-staged adhesive layer is different from a glass transition temperature of the fourth B-staged adhesive layer.

12. The chip package according to claim 1, wherein a glass transition temperature of the first B-staged adhesive layer is substantially the same with a glass transition temperature of the second B-staged adhesive layer.

13. The chip package according to claim 1, wherein a glass transition temperature of the first B-staged adhesive layer is different from a glass transition temperature of the second B-staged adhesive layer.

14. A chip package, comprising:
a carrier having an opening;
a first chip disposed on the carrier, wherein the first chip has a first active surface and a first rear surface opposite to the first active surface;
a plurality of bumps disposed between the carrier and the first active surface of the first chip, wherein the first chip is electrically connected with the carrier and through the bumps;
a second chip disposed on the carrier, wherein the first chip and the second chip are located at two opposite side of the carrier;
a plurality of bonding wires electrically connected with the carrier and the second chip, wherein each of the bonding wires passes through the opening of the carrier; and
a first adhesive layer adhered between the first active surface of the first chip and the carrier, wherein the first adhesive layer comprises:
a first B-staged adhesive layer adhered on the first active surface of the first chip;

a second B-staged adhesive layer adhered between the first B-staged adhesive layer and the carrier, wherein the first B-staged adhesive layer covers the first active surface of the first chip except for an area occupied by the bumps, and the second B-staged adhesive layer disposed on a portion area of the first B-staged adhesive layer to encapsulate a top portion of each bonding wire; and
a molding compound disposed on the carrier to cover the first chip, the second chip, the bumps, the first adhesive layer and the bonding wires.

15. The chip package according to claim 14, wherein the second B-staged adhesive layer is disposed on a portion area of the first B-staged adhesive layer without encapsulating the bumps.

16. A chip package, comprising:
a carrier having an opening;
a first chip disposed on the carrier, wherein the first chip has a first active surface and a first rear surface opposite to the first active surface;
a plurality of bumps disposed between the carrier and the first active surface of the first chip, wherein the first chip is electrically connected with the carrier and through the bumps;
a second chip disposed on the carrier, wherein the first chip and the second chip are located at two opposite side of the carrier;
a plurality of bonding wires electrically connected with the carrier and the second chip, wherein each of the bonding wires passes through the opening of the carrier; and
a first adhesive layer adhered between the first active surface of the first chip and the carrier, wherein the first adhesive layer comprises:
a first B-staged adhesive layer adhered on the first active surface of the first chip; and
a second B-staged adhesive layer adhered between the first B-staged adhesive layer and the carrier, wherein the first B-staged adhesive layer comprises a plurality of first B-staged adhesive posts, the second B-staged adhesive layer comprises a plurality of second B-staged adhesive posts disposed on the first B-staged adhesive posts, and the first B-staged adhesive posts and the second B-staged adhesive posts encapsulate the bumps; and
a molding compound disposed on the carrier to cover the first chip, the second chip, the bumps, the first adhesive layer and the bonding wires.

17. A chip package, comprising:
a carrier having an opening;
a first chip disposed on the carrier, wherein the first chip has a first active surface and a first rear surface opposite to the first active surface;
a plurality of bumps disposed between the carrier and the first active surface of the first chip, wherein the first chip is electrically connected with the carrier and through the bumps;
a second chip disposed on the carrier, wherein the first chip and the second chip are located at two opposite side of the carrier;
a plurality of bonding wires electrically connected with the carrier and the second chip, wherein each of the bonding wires passes through the opening of the carrier; and
a first adhesive layer adhered between the first active surface of the first chip and the carrier, wherein the first adhesive layer comprises:
a first B-staged adhesive layer adhered on the first active surface of the first chip; and a second B-staged adhesive layer adhered between the first B-staged adhesive layer and the carrier, wherein the first B-staged adhesive layer covers the first active surface of the first chip except for an area occupied by the bumps, the second B-staged adhesive layer comprises a plurality of second B-staged adhesive posts disposed on the first B-staged adhesive layer, and the first B-staged adhesive layer and the second B-staged adhesive posts encapsulate the bumps; and a molding compound disposed on the carrier to cover the first chip, the second chip, the bumps, the first adhesive layer and the bonding wires.

* * * * *